(12) United States Patent
Cho et al.

(10) Patent No.: US 9,793,787 B2
(45) Date of Patent: Oct. 17, 2017

(54) MOTOR DRIVING DEVICE AND AIR CONDITIONER INCLUDING THE SAME

(71) Applicant: LG ELECTRONICS INC., Seoul (KR)

(72) Inventors: Wonwoo Cho, Changwon-si (KR); Gwigeun Park, Changwon-si (KR)

(73) Assignee: LG ELECTRONICS INC., Seoul (KR)

( * ) Notice: Subject to any disclaimer, the term of this patent is extended or adjusted under 35 U.S.C. 154(b) by 375 days.

(21) Appl. No.: 14/566,368

(22) Filed: Dec. 10, 2014

(65) Prior Publication Data

US 2015/0171727 A1 Jun. 18, 2015

(30) Foreign Application Priority Data

Dec. 10, 2013 (KR) ........................ 10-2013-0153375

(51) Int. Cl.
*H02M 1/08* (2006.01)
*H02M 7/483* (2007.01)
(Continued)

(52) U.S. Cl.
CPC .............. *H02M 1/08* (2013.01); *F25B 31/02* (2013.01); *H02M 7/483* (2013.01); *H02P 6/14* (2013.01);
(Continued)

(58) Field of Classification Search
CPC .................................. H02M 1/08; H02M 1/10
(Continued)

(56) References Cited

U.S. PATENT DOCUMENTS 7,466,168 B1 12/2008 Wittenbreder, Jr.
2009/0113908 A1* 5/2009 Hwang ................ F24F 11/0079
62/228.1

(Continued)

FOREIGN PATENT DOCUMENTS

JP 2004166359 A * 6/2004
WO WO 2013/179771 12/2013

OTHER PUBLICATIONS

European Search Report issued in Application No. 14197007.9 dated Apr. 28, 2015.
(Continued)

*Primary Examiner* — Kawing Chan
(74) *Attorney, Agent, or Firm* — KED & Associates, LLP

(57) ABSTRACT

A motor driving device and an air conditioner including the same are disclosed. The disclosed motor driving device includes a multi-level converter to receive AC power, thereby outputting multi-level power, the multi-level converter including plural diodes and plural switching elements, plural capacitors for storing the multi-level power from the multi-level converter, and a gate drive signal generator to generate gate drive signals for the switching elements of the multi-level converter. The gate drive signal generator includes a gate drive power source to supply a gate drive voltage, a gate driver to generate the gate drive signals, using the gate drive voltage, a gate capacitor connected to both terminals of the gate driver, and a gate switching element connected between one end of the gate capacitor and one end of one of the plural capacitors. Accordingly, gate drive signals for the multi-level converter can be generated.

19 Claims, 8 Drawing Sheets

(51) Int. Cl.
  *F25B 31/02*   (2006.01)
  *H02P 6/14*    (2016.01)
  *H03K 17/60*   (2006.01)
  *H02M 5/44*    (2006.01)
  *H02M 1/00*    (2006.01)

(52) U.S. Cl.
  CPC .............. *H03K 17/60* (2013.01); *H02M 5/44* (2013.01); *H02M 2001/0006* (2013.01); *H03K 2217/0081* (2013.01)

(58) Field of Classification Search
  USPC ................................ 318/400.3, 400.01, 700
  See application file for complete search history.

(56) References Cited

U.S. PATENT DOCUMENTS

| | | | | |
|---|---|---|---|---|
| 2011/0074489 | A1* | 3/2011 | Viitanen | H02M 1/08 327/427 |
| 2013/0083580 | A1* | 4/2013 | Komiya | H02M 7/5387 363/131 |

OTHER PUBLICATIONS

Jahns et al., "A Self-Boost Charge Pump Topology for a Gate Drive High-Side Power Supply," IEEE Transactions on Power Electronics, vol. 20, No. 2, Mar. 2005.

\* cited by examiner

MOTOR DRIVING DEVICE AND AIR CONDITIONER INCLUDING THE SAME

CROSS-REFERENCE TO RELATED APPLICATION

This application claims priority under 35 U.S.C. §119 to Korean Application No. 10-2013-0153375, filed on Dec. 10, 2013, in the Korean Intellectual Property Office, whose entire disclosure is incorporated herein by reference.

BACKGROUND

1. Field

The present disclosure relates to a motor driving device and an air conditioner including the same, and more particularly to a motor driving device capable of generating a gate drive signal for a multi-level converter and an air conditioner including the same.

2. Background

An air conditioner is installed to provide a pleasant indoor environment to persons by adjusting indoor temperature and conditioning indoor air through discharge of hot or cold air into an indoor space. Generally, such an air conditioner includes an indoor unit installed in an indoor space while including a heat exchanger, and an outdoor unit including a compressor and a heat exchanger, to supply refrigerant to the indoor unit.

BRIEF DESCRIPTION OF THE DRAWINGS

The embodiments will be described in detail with reference to the following drawings in which like reference numerals refer to like elements wherein.

DETAILED DESCRIPTION

Figure 1:
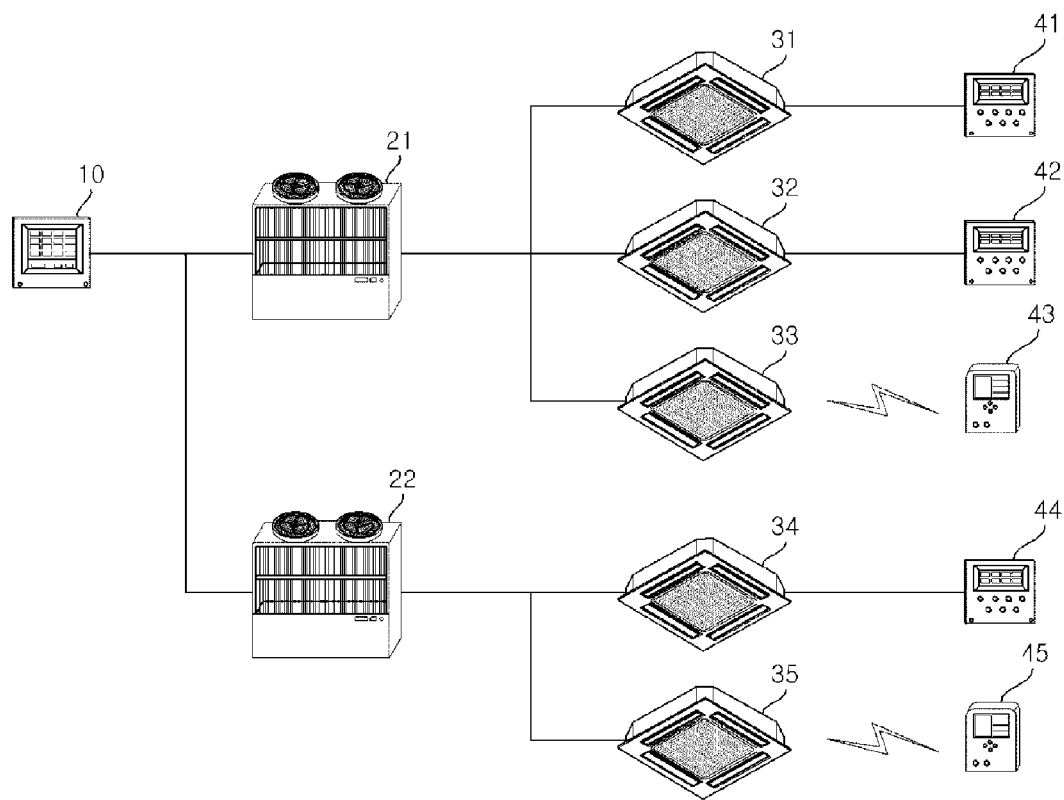
FIG. 1 is a view illustrating a configuration of an air conditioner according to an embodiment of the present disclosure.

FIG. 1 is a view illustrating a configuration of an air conditioner according to an embodiment of the present disclosure. The air conditioner may include a plurality of indoor units 31 to 35, a plurality of outdoor units 21 and 22 each connected to associated ones of the indoor units 31 to 35, and remote controllers 41 to 45 connected to respective indoor units 31 to 35. The air conditioner may further include a remote control unit 10 to control the plural indoor units 31 to 35 and outdoor units 21 and 22.

The remote control unit 10 is connected to the indoor units 31 to 36 and outdoor units 21 and 22, and monitors and controls operations of the indoor units 31 to 36 and outdoor units 21 and 22. In this case, the remote control unit 10 may perform operation setting, lock setting, schedule control, group control, etc. for the indoor units 31 to 36 connected thereto.

As the air conditioner, any one of a stand type air conditioner, a wall-mounted air conditioner and a ceiling-mounted air conditioner is applicable. For convenience of description, however, the following description will be given only in conjunction with a ceiling-mounted air conditioner. Meanwhile, the air conditioner may further include at least one of a ventilator, an air cleaner, a humidifier, and a heater. These devices may be operatively connected to the indoor units and outdoor units.

Each of the outdoor units 21 and 22 includes a compressor for compressing refrigerant supplied thereto, an outdoor heat exchanger for exchanging heat between refrigerant and outdoor air, an accumulator for separating gaseous refrigerant from refrigerant supplied thereto, and supplying the separated gaseous refrigerant to the compressor, and a 4-way valve for selecting a flow path of refrigerant according to heating operation. Although each of the outdoor units 21 and 22 further includes a plurality of sensors, a plurality of valves, and an oil collector, etc., no description will be given of configurations of these elements.

Each of the outdoor units 21 and 22 operates the compressor and outdoor heat exchanger included therein, to perform compression and heat exchange of refrigerant, and supplies the resultant refrigerant to associated ones of the indoor units 31 to 35. Each of the outdoor units 21 and 22 is driven in accordance with a request from the remote control unit 10 or an associated one or ones of the indoor units 31 to 35. Thus, the number of operating outdoor units and the number of operating compressors included in the operating outdoor units is varied as the cooling/heating capacity of the air conditioner is varied in accordance with the number of operating indoor units.

Although the outdoor units 21 and 22 are described in conjunction with the case in which each outdoor unit supplies refrigerant to associated ones of the indoor units, the connection arrangement of the outdoor units and indoor units may be varied such that plural outdoor units are interconnected to supply refrigerant to each indoor unit.

Each of the indoor units 31 to 35 is connected to one of the plural outdoor units 21 and 22 and, as such, receives refrigerant from the outdoor unit connected thereto and discharges cold air to an indoor space. Each of the indoor units 31 to 35 includes an indoor heat exchanger, an indoor fan, an expansion valve to expand refrigerant supplied thereto, and a plurality of sensors.

Each of the indoor units 31 to 35 and an associated one of the outdoor units 21 and 22 are connected by a communication line and, as such, receive and transmit data therebetween. Each outdoor unit and each indoor unit are connected to the remote control unit 10 by a separate communication line and, as such, operate under control of the remote control unit 10.

Each of the remote controllers 41 to 45 is connected to an associated one of the indoor units 31 to 35 and, as such, may input a control command from the user to the connected indoor unit, and may receive state information from the connected indoor unit, to display the received state information. In this case, each of the remote controllers 41 to 45 communicates with the indoor unit connected thereto in a wired or wireless manner in accordance with the connection type thereof. In some cases, a single remote controller may be connected to a plurality of indoor units and, as such, setting of the plural indoor units may be changed by an input from the single remote controller.

In addition, each of the remote controllers 41 to 45 may include a temperature sensor equipped therein.

Figure 2:
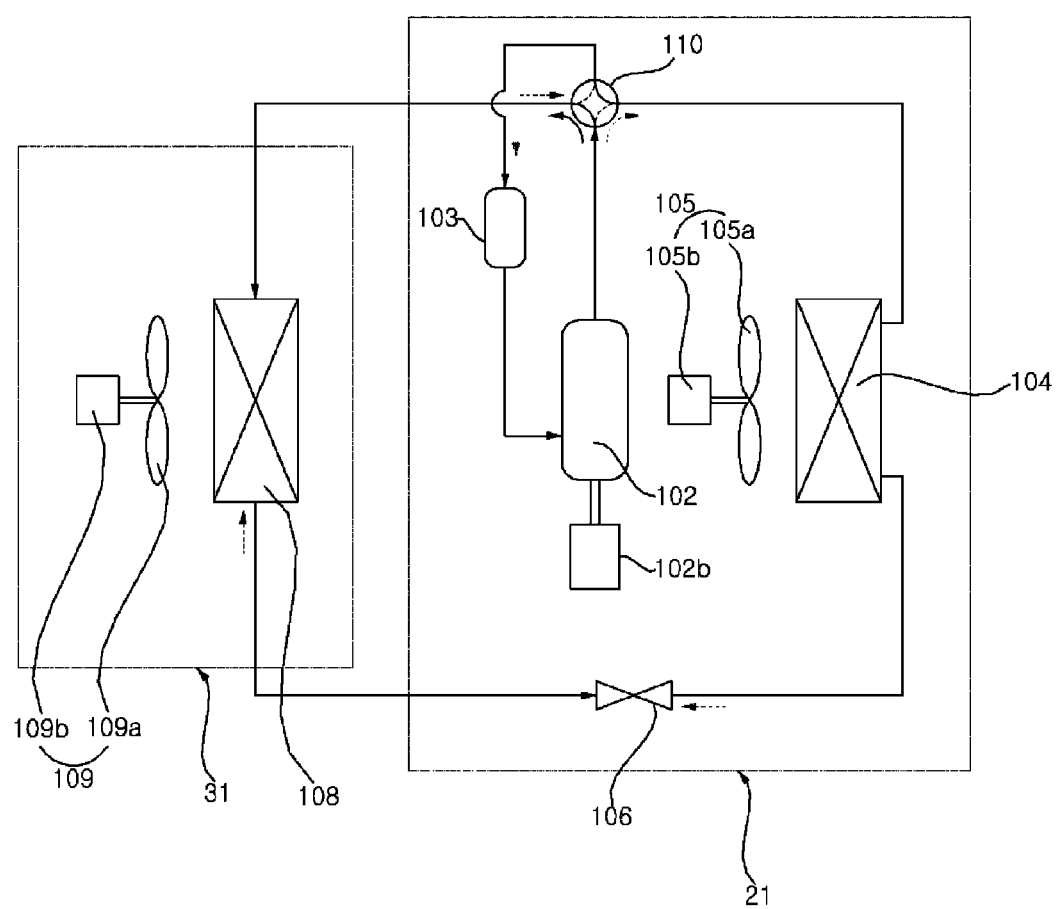
FIG. 2 is a schematic view of one outdoor unit and one indoor unit, which are included in the air conditioner of FIG. 1.

FIG. 2 is a schematic view of one outdoor unit and one indoor unit, which are included in the air conditioner of FIG. 1.

Referring to FIG. 2, the air conditioner, which is designated by reference numeral "50", mainly include an indoor unit, for example, the indoor unit 31, and an outdoor unit, for example, the outdoor unit 21.

The outdoor unit 21 includes a compressor 102 functioning to compress refrigerant, a compressor motor 102b to drive the compressor 102, an outdoor heat exchanger 104 functioning to discharge heat from the compressed refrigerant, and an outdoor blowing unit 105 including an outdoor fan 105a disposed at one side of the outdoor heat exchanger 104, to promote heat discharge of refrigerant, and a motor 105b to rotate the outdoor fan 105a. The outdoor unit 21 further includes an expansion device 106 to expand concentrated refrigerant, a cooling/heating switching valve 110 to change a flow path of compressed refrigerant, and an accumulator 103 to temporarily store gasified refrigerant, and then to supply the stored refrigerant to the compressor at a constant pressure after removing moisture and foreign matter from the refrigerant.

The indoor unit 31 includes an indoor heat exchanger 108 disposed in an indoor space, to perform a cooling/heating function, and an indoor blowing unit 109 including an indoor fan 109a disposed at one side of the indoor heat exchanger 108, to promote heat discharge of refrigerant, and a motor 109b to rotate the indoor fan 109a.

The indoor unit 31 may include at least one indoor heat exchanger 109. As the compressor 102, at least one of an inverter compressor and a constant speed compressor may be used.

Meanwhile, the air conditioner 50 may be configured as a cooler to cool an indoor space. Alternatively, the air conditioner 50 may be configured as a heat pump to cool or heat an indoor space.

Although one indoor unit 31 and one outdoor unit 21 are illustrated in FIG. 2, the air conditioner according to the illustrated embodiment of the present disclosure is not limited thereto. For example, embodiments of the present disclosure are applicable to a multi-type air conditioner including a plurality of indoor units and a plurality of outdoor units, and an air conditioner including a single indoor unit and a plurality of outdoor units.

Figure 3:
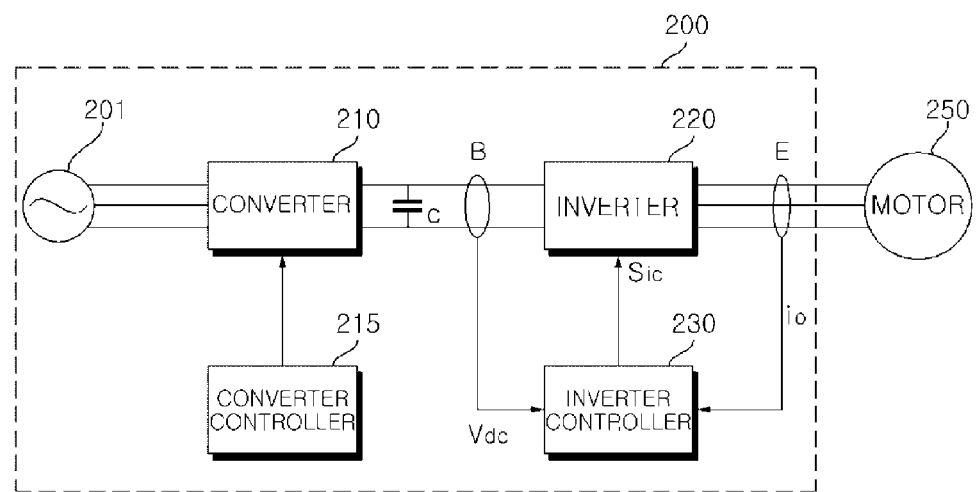
FIG. 3 is a block diagram of a compressor motor driving device equipped in each outdoor unit illustrated in FIG. 1.
Figure 4:
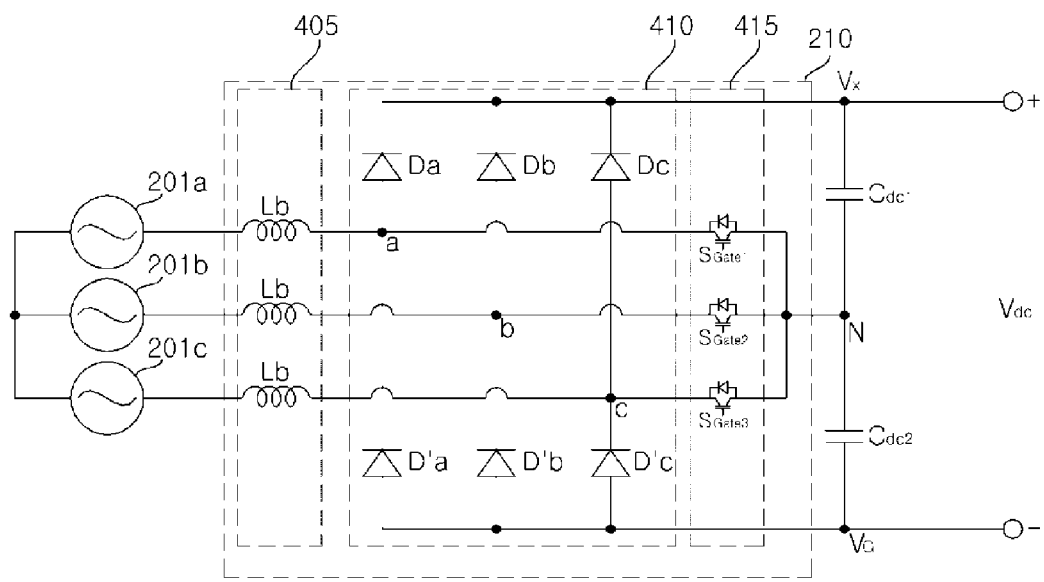
FIG. 4 is a circuit diagram illustrating an example of an internal circuit of a converter illustrated in FIG. 3.
Figure 5:
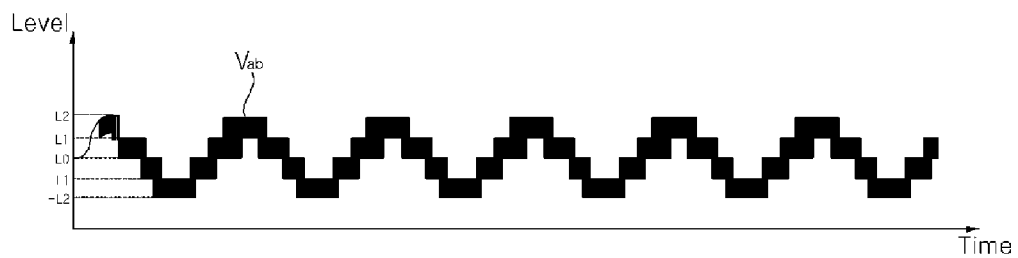
FIG. 5 illustrates a waveform of multi-level power output from a multi-level converter illustrated in FIG. 4.

FIG. 3 is a block diagram of a compressor motor driving device equipped in each outdoor unit illustrated in FIG. 1. FIG. 4 is a circuit diagram illustrating an example of an internal circuit of a converter illustrated in FIG. 3. FIG. 5 illustrates a waveform of multi-level power output from a multi-level converter illustrated in FIG. 4.

The compressor 102 included in each outdoor unit illustrated in FIG. 1, for example, the outdoor unit 21, may be driven by a compressor motor driving device 200 to drive the compressor motor 250.

The compressor motor driving device 200 may include an inverter 220 to output 3-phase AC current to the compressor motor 250, an inverter controller 230 to control the inverter 220, and a converter 210 to supply DC power to the inverter 220. The compressor motor driving device 200 may further include a converter controller 215 to control the converter 210.

The motor driving device 200 receives AC power from a power supply system, converts the received power, and then supplies the converted power to the motor 250. In this regard, the motor driving device 200 may be referred to as a "power converting device".

Meanwhile, in accordance with the present disclosure, the converter 210 to supply DD power to the inverter 220 is a multi-level converter capable of outputting multi-level power. The multi-level converter may have a configuration illustrated in FIG. 4.

In particular, the multi-level converter may include a plurality of diodes and a plurality of switching elements. In this case, gate drive signals for the plural switching elements may be generated in the converter controller 215.

Referring to FIG. 4, the multi-level converter 210 may include a plurality of reactors or inductors 405, a 3-phase rectifier 410, and a switching unit 415 including a plurality of switching elements.

Each of the plural reactors 405 is connected between an associated one of 3-phase AC power sources 201a, 201b, and 201c and the 3-phase rectifier 410, to reduce noise caused by the associated 3-phase AC power source 201a, 201b or 201c or a noise component caused by a load arranged downstream of the converter.

The 3-phase rectifier 410 may be connected between the plural reactors 405 and the switching unit 415, to rectify 3-phase AC power.

FIG. 4 illustrates three pairs of arm diodes connected in parallel, namely, a pair of arm diodes Da and D'a, a pair of arm diodes Db and D'b and a pair of arm diodes Dc and D'c. Each arm diode pair includes one upper arm diode Da, Db or Dc and one lower arm diode D'a, D'b or D'c, which are connected in series.

Referring to FIG. 4, the node between the series-connected upper and lower arm diodes Da and D'a is referred to as a "node a", the node between the series-connected upper and lower arm diodes Db and D'b is referred to as a "node b", and the node between the series-connected upper and lower arm diodes Dc and D'c is referred to as a "node c".

Each of the plural switching elements in the switching unit 415, namely, switching elements SGate1, SGate2 and SGate3, may be an insulated gate bipolar transistor (IGBT) type switching element, and may be connected between the 3-phase rectifier 410 and a virtual neutral point among a plurality of capacitors, for example, a virtual neutral point N between two capacitors Cdc1 and Cdc2 in the illustrated case.

In detail, the first switching element SGate1 is connected between the node a and the virtual neutral point N, the second switching element SGate2 is connected between the node b and the virtual neutral point N, and the third switching element SGate3 is connected between the node c and the virtual neutral point N.

In accordance with operations of the switching elements SGate1, SGate2 and SGate3, a multi-level power waveform may be output. That is, as illustrated in FIG. 5, a multi-level power waveform having five levels L2, L1, L0, −L1, and −L2 may be output from the converter 210.

The plural capacitors Cdc1 and Cdc2 may store the multi-level power output from the converter. The first capacitor Cdc1 and second capacitor Cdc2 are connected in series. The node between the first capacitor Cdc1 and the second capacitor Cdc2 may be a virtual neutral point N.

Accordingly, when the first capacitor Cdc1 and second capacitor Cdc2 have the same capacitance, a voltage corresponding to ½ Vdc may be stored in each of the first capacitor Cdc1 and second capacitor Cdc2 and, as such, a voltage Vdc may be stored between both ends VX and VG of the capacitors Cdc1 and Cdc2.

The converter controller 215 may control the multi-level converter 210, which includes the plural switching elements SGate1, SGate2 and SGate3. In particular, the converter controller 215 may output switching control signals for respective switching elements. When the switching elements SGate1, SGate2 and SGate3 are IGBT type switching elements, the converter controller 215 may generate gate drive signals.

Each gate drive signal output from the converter controller 215 is applied to an associated one of the switching elements SGate1, SGate2 and SGate3. In this case, each gate drive signal may have a voltage level higher than the virtual neutral point N by a gate drive voltage for the associated switching element. This will be described later with reference to FIGS. 7 to 9.

The inverter 220 may include a plurality of inverter switching elements, to convert smoothed DC power Vdc into 3-phase AC power having a predetermined frequency and then to output the 3-phase AC power to the motor 250, which may be a 3-phase motor, in accordance with ON/OFF operations of the switching elements.

In detail, the inverter 220 includes a plurality of switching elements. For example, the inverter 220 includes three pairs of arm switching elements connected in parallel. Each arm switching element pair includes an upper arm switching element and a lower arm switching element, which are connected in series. A diode is connected to each arm switching element in anti-parallel.

The inverter controller 230 may output an inverter switching control signal Sic to the inverter 220, to control switching operation of the inverter 220. The inverter switching control signal Sic is a pulse width modulated (PWM) switching control signal. The inverter switching control signal Sic may be generated, based on output a current io flowing through the motor 250 or a DC link voltage Vdc between both ends VX and VG of the plural capacitors. In this case, the output current io may be detected by an output current detector E, and the DC link voltage Vdc may be detected by a DC link voltage detector B.

The output current detector E may detect the output current io flowing between the inverter 220 and the motor 250. That is, the output current detector E detects current flowing through the motor 250. The output current detector E may detect output currents of all phases, namely, output current ia, ib, and ic. Alternatively, the output current detector E may detect output currents of two phases through balance of three phases.

The output current detector E may be arranged between the inverter 220 and the motor 250. For current detection, a current transformer (CT), a shunt resistor, or the like may be employed as the output current detector E.

The inverter controller 230 may include an axial transformer, a velocity calculator, a current command generator, a voltage command generator, and a switching control signal output unit.

The axial transformer receives 3-phase output currents ia, ib, and ic detected by the output current detector E, and transforms the 3-phase output currents ia, ib, and ic into 2-phase currents iα and iβ in a stationary reference frame.

Meanwhile, the axial transformer may transform the 2-phase currents iα and iβ in the stationary reference frame into 2-phase currents id and iq in a rotating reference frame.

The velocity calculator may calculate a velocity $\hat{\omega}_r$, based on a rotor position signal H input from a position sensor. That is, it is possible to calculate the velocity $\hat{\omega}_r$ by dividing a rotor position based on the position signal by time.

Meanwhile, the position sensor may sense a rotor position of the motor 250. For this function, the position sensor may include a Hall sensor.

Meanwhile, the velocity calculator may output a position $\hat{\theta}_r$ and a velocity $\hat{\omega}_r$, which are calculated, based on the rotor position signal H input to the velocity calculator.

Meanwhile, the current command generator calculates a velocity command value ω*r, based on the calculated velocity $\hat{\omega}_r$ and a target velocity ω. The current command generator also generates a current command value i*q, based on the velocity command value ω*r. For example, the current command generator may perform proportional-integral (PI) control through a PI controller included therein, based on a difference between the calculated velocity $\hat{\omega}$ and the target velocity ω, namely, the velocity command value ω*r, and, as such, may generate a current command value i*q. Although the current command generator generates the current command value i*q, namely, a q-axis current command value, it may be possible to generate a d-axis current command value rd, together with the q-axis current command value i*q. The d-axis current command value i*d may be set to "0".

Meanwhile, the current command generator may further include a limiter to limit the level of the current command value i*q in order to prevent the current command value i*q from being outside a predetermined range.

The voltage command generator generates d and q-axis voltage command values v*d and v*q, based on d and q-axis currents id and iq generated through axial transformation to a 2-phase rotating reference frame in the axial transformer and current command values i*d and i*q from the current command generator. For example, the voltage command generator may perform PI control through the PI controller, based on a difference between the q-axis current iq and the q-axis current command value i*q and, as such, may generate a q-axis voltage command value v*q. The voltage command generator may additionally perform PI control through the PI controller, based on a difference between the d-axis current id and the d-axis current command value i*d and, as such, may generate a d-axis voltage command value v*d. When the d-axis current command value i*d is set to "0", the d-axis voltage command value v*d may be set to "0".

Meanwhile, the voltage command generator may further include a limiter to limit the levels of the voltage command values v*d and v*q in order to prevent the voltage command values v*d and v*q from being outside a predetermined range.

The generated d and q-axis voltage command values v*d and v*q are input to the axial transformer.

The axial transformer receives the position $\hat{\theta}_r$ calculated by the velocity calculator and the d and q-axis voltage command values v*d and v*q and, as such, perform axial transformation.

First, the axial transformer performs transformation from a 2-phase rotating reference frame to a 2-phase stationary reference frame. In this case, the position $\hat{\theta}_r$ calculated by the velocity calculator may be used.

The axial transformer performs transformation from a 2-phase stationary reference frame to a 3-phase stationary reference frame. Through the axial transformation, the axial transformer outputs 3-phase output voltage command values v*a, v*b, and v*c.

The switching control signal output unit generates an inverter switching control signal Sic according to PWM, based on the 3-phase output voltage command values v*a, v*b, and v*c.

The inverter switching control signal Sic output from the switching control signal output unit may be converted into a gate drive signal in a gate driver. The gate drive signal may be input to the gate of each switching element in the inverter 220. As a result, the switching elements in the inverter 220 perform switching operations, respectively.

Figure 6A:
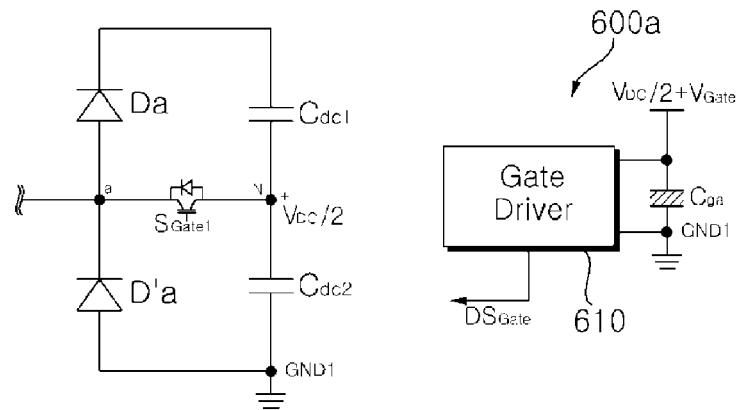
FIGS. 6A and 6B are diagrams explaining a method of generating gate drive signals to be applied to the multi-level converter of FIG. 4.
Figure 6B:
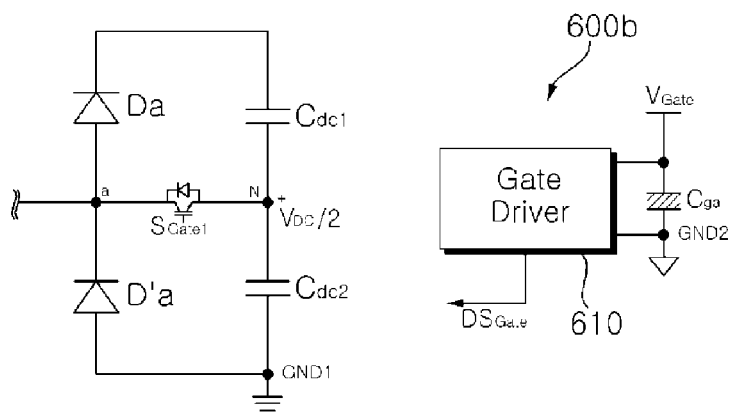

FIGS. 6A and 6B are diagrams explaining a method of generating gate drive signals to be applied to the multi-level converter of FIG. 4.

FIG. 6A illustrates connection of the first switching element SGate1 between the node between the first upper arm diode Da and the first lower arm diode D'a, namely, the node a, and the virtual neutral point N.

FIG. 6A illustrates an non-insulation type structure in which a DC stage and a gate drive signal generator 600a use a common ground terminal GND1.

When the gate drive signal generator 600a as illustrated in FIG. 6A is used for generation of a gate drive signal DSGate for the first switching element SGate1, it is necessary to supply a voltage corresponding to "VDC/2+VGate" to a gate driver 610. When the voltage VGate is 15V, and the voltage VDC/2 is about 385V, it is necessary to supply a voltage of 400V. To this end, the gate driver 610 should have durability to 400V. A gate capacitor Cga having durability to 400V is also required. For this reason, it is difficult to efficiently design the motor driving device and, as such, an increase in manufacturing cost may occur.

FIG. 6B illustrates connection of the first switching element SGate1 between the node between the first upper arm diode Da and the first lower arm diode D'a, namely, the node a, and the virtual neutral point N, similarly to FIG. 6A.

FIG. 6B illustrates an insulation type structure in which a DC stage and a gate drive signal generator 600b use different ground terminals GND1 and GND2, respectively.

When the gate drive signal generator 600b as illustrated in FIG. 6B is used for generation of a gate drive signal DSGate for the first switching element SGate1, it is necessary to supply a voltage VGate to the gate driver 610.

Meanwhile, the voltage VGate is supplied to one end of the gate capacitor Cga. In this case, a separate ground terminal, namely, the ground terminal GND2, is necessary for grounding of the gate capacitor Cga at the other end thereof, differently than the case of FIG. 6A in which the ground terminal GND1 is connected to the other end of the gate capacitor Cga.

That is, additional ground terminal formation is required. To this end, it is necessary to provide an additional channel at a switched mode power supply (SMPS) to supply various drive or operating voltages to the motor driving device 200.

The present disclosure proposes a gate drive power source, which is not required to supply a high voltage and, as such, does not require an additional channel for the SMPS, differently than the cases of FIGS. 6A and 6B. This will be described hereinafter with reference to FIGS. 7 to 9.

Figure 7:
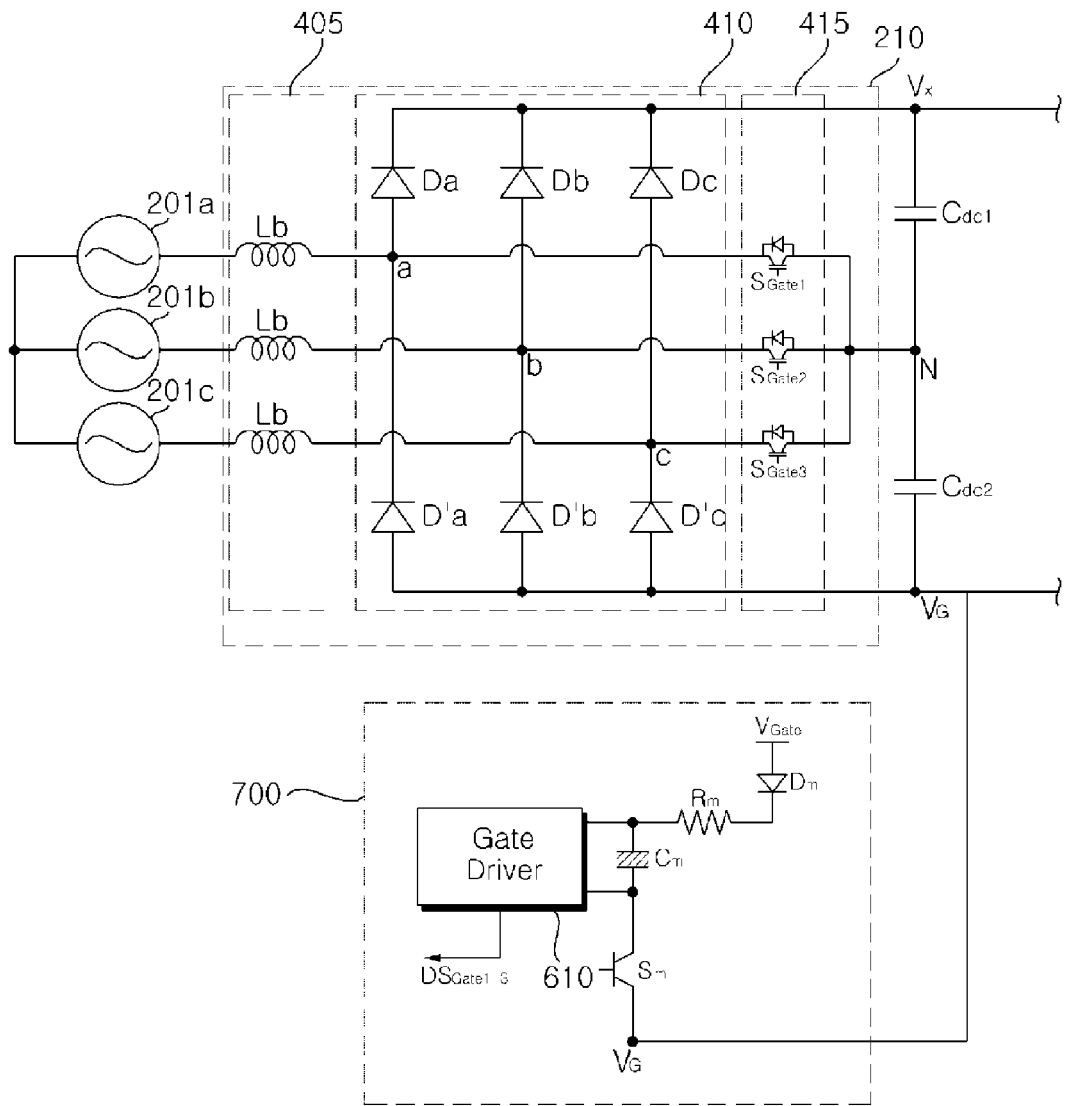
FIG. 7 is a circuit diagram illustrating a motor driving device including a gate drive signal generator according to an embodiment of the present disclosure.
Figure 8A:
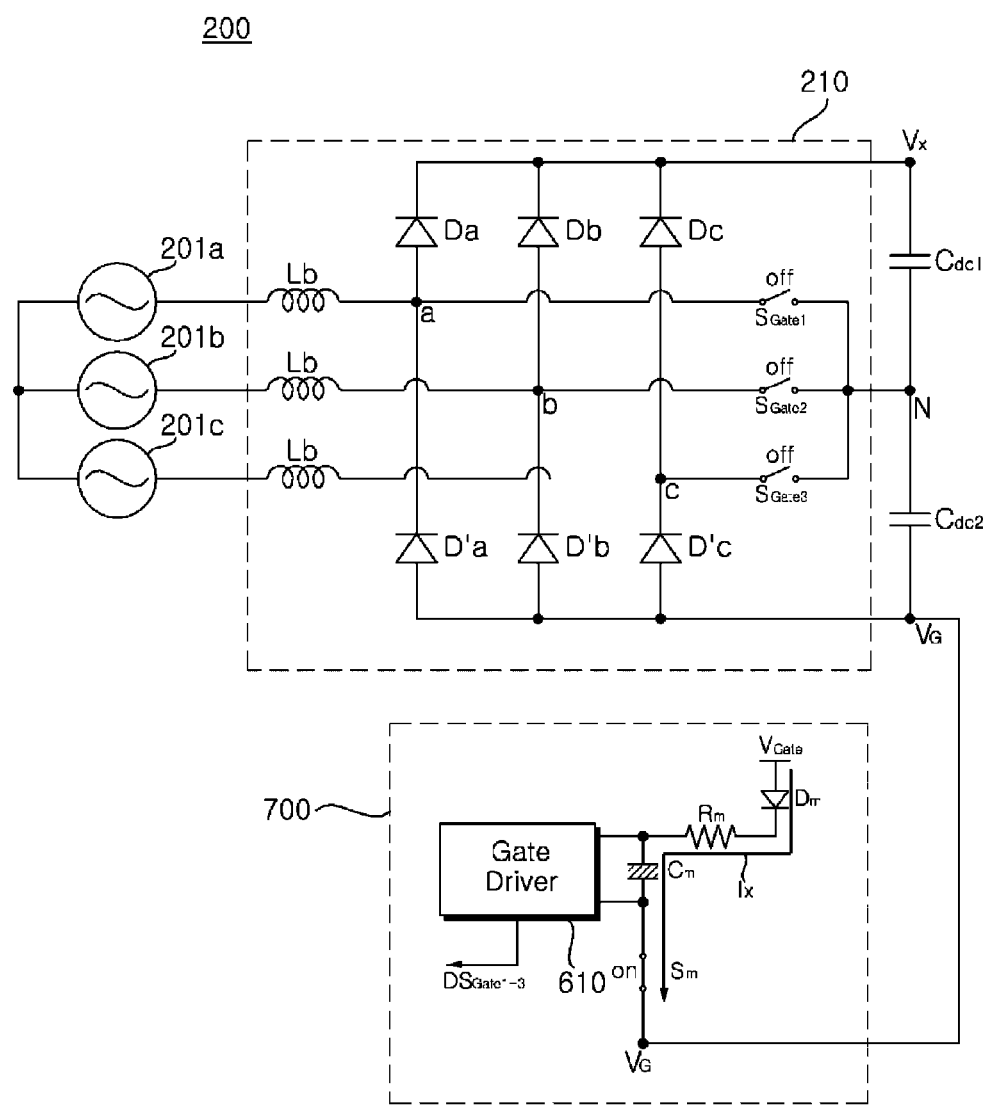
FIGS. 8A to 9 are diagrams explaining operation of the gate drive signal generator illustrated in FIG. 7.

FIG. 7 is a circuit diagram illustrating a motor driving device including a gate drive signal generator according to an embodiment of the present disclosure. FIGS. 8A to 9 are diagrams explaining operation of the gate drive signal generator illustrated in FIG. 7.

Referring to FIG. 7, the gate drive signal generator, which is designated by reference numeral "700", may include a gate drive power source VGate, a gate driver 610, a gate capacitor Cm, and a gate switching element Sm. The gate drive signal generator 700 may further include a diode Dm and a resistor Rm.

The gate drive power source VGate may supply a gate drive voltage. For example, the gate drive power source VGate may supply a voltage of about 15V.

The gate driver 610 generates gate drive signals DSGate1 to DSGate3 for respective switching elements SGate1, SGate2 and SGate3 of the multi-level converter 210. For this function, the gate capacitor Cm is connected between both terminals of the gate driver 610. The gate drive voltage from the gate drive power source VGate is stored in the gate capacitor Cm. Using the gate voltage stored in the gate capacitor Cm, the gate driver 610 may generate the gate drive signals DSGate1 to DSGate3 based on the gate drive voltage.

Meanwhile, the gate switching element Sm may be connected between one end of the gate capacitor Cm and one end of a selected one of the plural capacitors, namely, one end VG of the second capacitor Cdc2.

The end VG of the second capacitor Cdc2 is connected to the gate switching element Sm, and may be, for example, a floating terminal.

Meanwhile, the diode Dm and resistor Rm may be electrically connected between the gate drive power source VGate and the gate driver, namely, between the gate drive power source VGate and the other end of the gate capacitor Cm.

It may be possible to prevent backflow of a current to the gate drive power source VGate by the diode Dm. Other circuit elements may be protected by the resistor Rm.

Referring to FIG. 8A, the gate switching element Sm of the gate drive signal generator 700 may be turned on when all switching elements of the multi-level converter 210 are in an OFF state. In this case, the gate drive voltage from the gate drive power source VGate is stored in the gate capacitor Cm via the diode Dm and resistor Rm.

FIG. 8A illustrates a current IX of the gate drive voltage from the gate drive power source VGate flowing toward the gate capacitor Cm via the diode Dm and resistor Rm. As a result, a gate voltage is stored in the gate capacitor Cm.

Figure 8B:
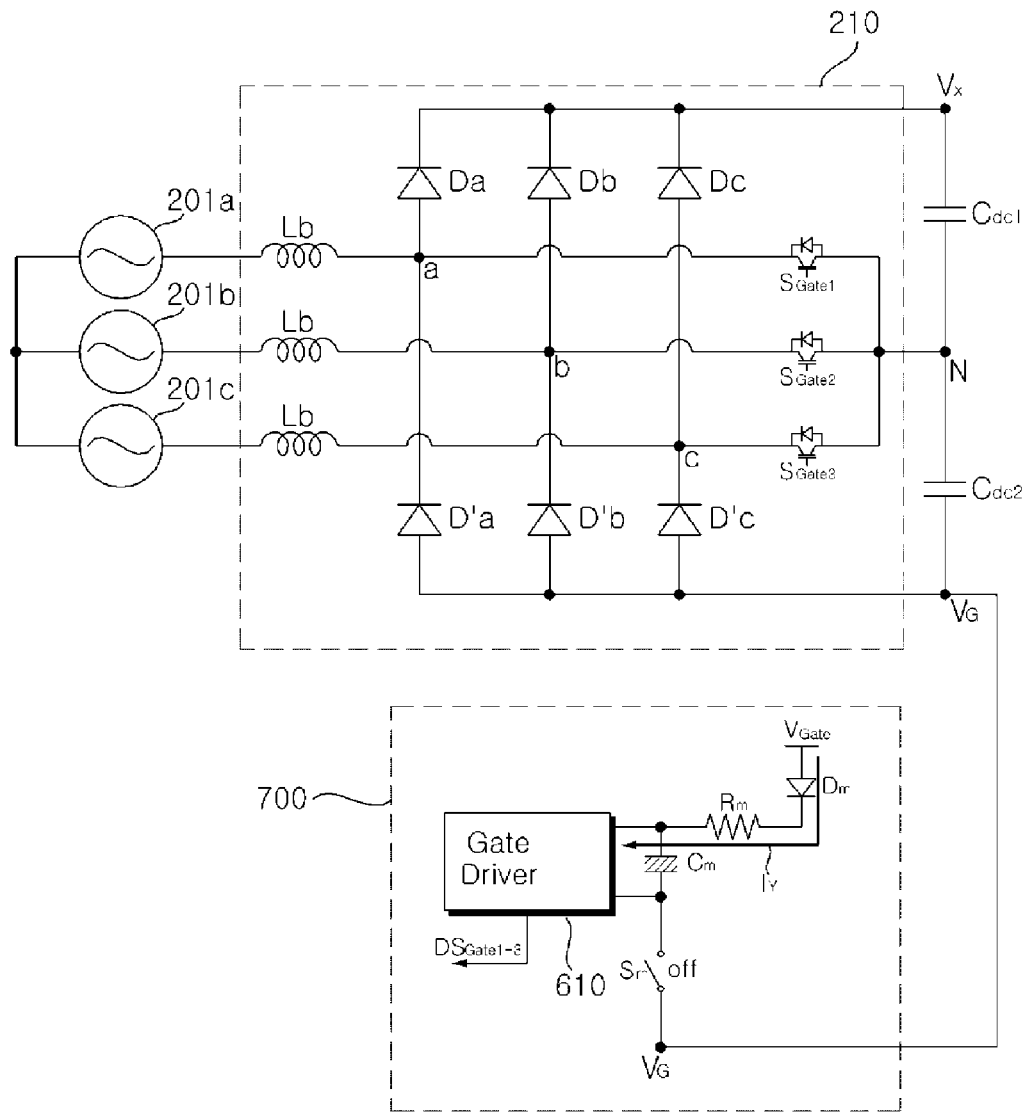
Figure 9:
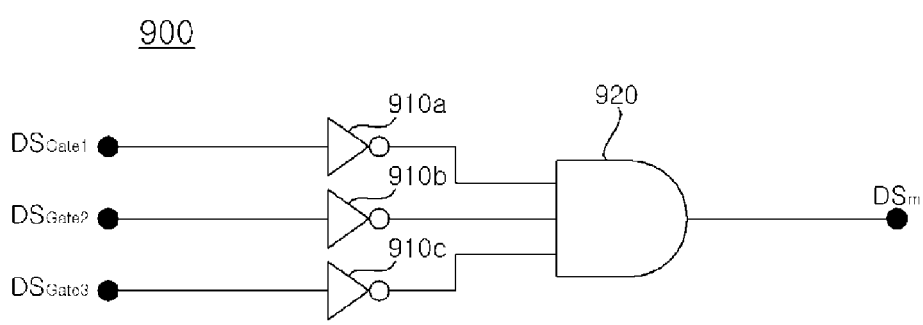

Referring to FIG. 8B, in accordance with storage of the gate voltage in the gate capacitor Cm, the gate switching element Sm of the gate drive signal generator 700 may then be turned off.

The gate driver 610 may generate gate drive signals DSGate1 to DSGate 3, which are based on the gate drive voltage, using the gate voltage stored in the gate capacitor Cm, namely, a voltage of about 15V.

Meanwhile, when the terminal VG is floated, the gate driver 610 may generate gate drive signals DSGate1 to DSGate 3, which are based on the gate drive voltage, using a voltage corresponding to "VG+15V", because the gate voltage VG stored in the gate capacitor Cm is added, as compared to the floated terminal VG.

Accordingly, the switching elements SGate1, SGate2 and SGate3 may be turned on or off, based on respective gate drive signals DSGate1, DSGate2 and DSGate3, which are based on the gate drive voltage.

For example, when each of the gate drive signals DSGate1 to DSGate3 has a high level, the switching element associated with the gate drive signal is turned on. On the other hand, when each of the gate drive signals DSGate1 to DSGate3 has a low level, the switching element associated with the gate drive signal is turned off.

Meanwhile, the gate drive signal generator 700 may be equipped in the above-described converter controller 215.

Thus, by virtue of the gate drive signal generator 700 as illustrated in FIGS. 7 to 8B, it is unnecessary for the gate drive power source VGate to supply a high voltage. It is also unnecessary to provide an additional channel at the SMPS, differently than the case of FIG. 6B. Accordingly, it is possible to effectively design the motor driving device 200.

Meanwhile, the DC stage and gate drive signal generator 700 are implemented in the form of a non-insulation type in that one end VG of the second capacitor Cdc2 is connected to one end of the gate switching element Sm. Accordingly, no separate ground pattern for the gate drive signal generator 700 is required and, as such, easy circuit design may be achieved. In addition, no separate ground pattern is required for the DC stage.

Meanwhile, FIG. 9 illustrates a gate switching signal generator 900 to generate a control signal for the gate switching element Sm.

The gate switching control signal generator 900 operates when all the switching elements SGate1, SGate2 and SGate3 of the multi-level converter 210 are in an OFF state, namely, a low-level state. Accordingly, the gate switching control signal generator 900 may include inverters 910a, 910b, and 910c connected to respective gate drive signals DSGate1, DSGate2 and DSGate3, and an AND gate 920 to execute a logic ANDing operation for high-level signals obtained through conversion operations of the inverters 910a, 910b, and 910c.

As a result, a control signal DSm having a high level for the switching element Sm is generated. Thus, it is possible to control the gate switching element Sm in a simple manner.

In accordance with one aspect of the present disclosure, each of the motor driving device and the air conditioner including the same includes a multi-level converter to receive AC power, thereby outputting multi-level power, the multi-level converter including a plurality of diodes and a plurality of switching elements, plural capacitors for storing the multi-level power from the multi-level converter, and a gate drive signal generator to generate gate drive signals for the switching elements of the multi-level converter. The gate drive signal generator includes a gate drive power source to supply a gate drive voltage, a gate driver to generate the gate drive signals, using the gate drive voltage, a gate capacitor connected to both terminals of the gate driver, and a gate switching element connected between one end of the gate capacitor and one end of one of the plural capacitors. Accordingly, gate drive signals for the multi-level converter can be generated.

In particular, the gate drive voltage from the gate drive power source is stored in the gate capacitor when the gate switching element is turned on. When the gate switching element is turned off, the gate driver may generate the gate drive signals, which are based on the gate drive voltage, using the gate drive voltage stored in the gate capacitor.

In particular, the degree of design freedom of the motor driving device may be enhanced because the gate drive signal generator can be configured without addition of a separate SMPS channel.

The motor driving device according to the present disclosure and the air conditioner including the same are not limited to configurations and methods according to the above-described embodiments. The above-described embodiments may be completely or partially combined to implement various alterations.

Meanwhile, the operation method of the motor driving device or air conditioner according to the present disclosure can be realized as a code, which can be written on a recording medium that can be read by a processor equipped in the motor driving device or air conditioner and can be read by a processor. The recording medium that can be read by a processor includes all kinds of recording media, on which data that can be read by a processor is written, such as a read only memory (ROM), a random access memory (RAM), a CD-ROM, a magnetic tape, a floppy disk, an optical data storage, and a carrier wave type (e.g., transmission over the Internet). The recording medium that can be read by a processor can be dispersed into computer systems connected to one another on a network, and codes that can be read by a processor can be stored in the recording medium in a dispersion manner and can be performed.

It is an object of the present disclosure to provide a motor driving device capable of generating a gate drive signal for a multi-level converter and an air conditioner including the same.

In accordance with an aspect of the present disclosure, the above and other objects can be accomplished by the provision of a motor driving device including a multi-level converter to receive AC power, thereby outputting multi-level power, the multi-level converter including a plurality of diodes and a plurality of switching elements, a plurality of capacitors to store the multi-level power from the multi-level converter, and a gate drive signal generator to generate gate drive signals for the switching elements of the multi-level converter, wherein the gate drive signal generator includes a gate drive power source to supply a gate drive voltage, a gate driver to generate the gate drive signals, using the gate drive voltage, a gate capacitor connected to both terminals of the gate driver, and a gate switching element connected between one end of the gate capacitor and one end of one of the plural capacitors.

In another aspect of the present disclosure, there is provided an air conditioner including a compressor to compress a refrigerant, a heat exchanger to perform heat exchange, using the compressed refrigerant, and a compressor motor driving device to drive a motor equipped in the compressor, wherein the compressor motor driving device includes a multi-level converter to receive AC power, thereby outputting multi-level power, the multi-level converter including a plurality of diodes and a plurality of switching elements, a plurality of capacitors to store the multi-level power from the multi-level converter, and a gate drive signal generator to generate gate drive signals for the switching elements of the multi-level converter, wherein the gate drive signal generator includes a gate drive power source to supply a gate drive voltage, a gate driver to generate the gate drive signals, using the gate drive voltage, a gate capacitor connected to both terminals of the gate driver, and a gate switching element connected between one end of the gate capacitor and one end of one of the plural capacitors.

In another aspect of the present disclosure, there is provided a motor driving device including a multi-level converter to output multi-level power, a plurality of capacitors to store the multi-level power from the multi-level converter, and a gate drive signal generator to generate gate drive signals for a plurality of switching elements in the multi-level converter, wherein the gate drive signal generator includes a gate switching element connected to a floated end of one of the plural capacitors, a gate capacitor for storing a gate drive voltage, and a gate driver to generate the gate drive signals, using the gate drive voltage stored in the gate capacitor.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A motor driving device comprising:
    rectifier having a plurality of diodes coupled in at least one of serially or in parallel;
    a plurality of transistors to control an operation of the plurality of diodes;
    a plurality of capacitors to store energy based an output of the rectifier; and
    a gate signal generator to generate gate drive signals for the transistors, wherein the gate drive signal generator includes:
        a gate driver to generate gate drive signals based on a gate drive voltage from a gate drive power source,
        a gate capacitor coupled to both terminals of the gate driver,
        a switch coupled between one terminal of the gate capacitor and one of the plurality of capacitors; and
        a diode and a resistor connected between another terminal of the gate capacitor and the gate drive power source, the diode preventing a backflow of current to the gate drive power source,
    wherein the one of the plurality of capacitors includes one terminal that is floated and is electrically connected to one terminal of the switch.

2. The motor driving device according to claim 1, wherein when the switch is turned on, the gate capacitor is configured to store energy based on the gate drive voltage, and
    when the switch is turned off, the gate driver generates the gate drive signals using the energy stored in the gate capacitor.

3. The motor driving device according to claim 2, wherein the switch is turned on when all of the plurality of transistors are turned off.

4. The motor driving device according to claim 1, wherein the gate signal generator further includes a resistor coupled to the gate capacitor and a terminal configured for connection a gate drive voltage.

5. The motor driving device according to claim 1, wherein each of the transistors is connected to a neutral node among the plurality of capacitors.

6. The motor driving device according to claim 1, further comprising:
    an inverter to provide AC power using the energy stored in the plurality of capacitors; and
    an inverter controller to control the inverter.

7. The motor driving device according to claim 1, further comprising a plurality of inductors configured to be coupled between an AC power source and the rectifier.

8. The motor driving device of claim 1, wherein the plurality of transistors comprises first, second and third transistors, the plurality of diodes comprises a first pair of diodes coupled in series, a second pair of diodes coupled in series, and a third pair of diodes coupled in series, the first pair, second pair and third pair being coupled in parallel, wherein a first node between the first pair of diodes is coupled to the first transistor, a second node between the second pair of diodes is coupled to the second transistor, and a third node between the third pair of diodes is coupled to the third transistor.

9. An air conditioner comprising:
    a compressor to compress a refrigerant;
    a heat exchanger to perform heat exchange, using the compressed refrigerant; and
    a compressor motor driving device to drive a motor equipped in the compressor, wherein the compressor motor driving device includes
    a rectifier having a plurality of diodes coupled in at least one of serially or parallel;
    a plurality of transistors to control an operation of the plurality of diodes;
    a plurality of capacitors to store energy based an output of the rectifier; and
    a gate drive signal generator to generate gate drive signals for the transistors, wherein the gate drive signal generator includes:
        a gate driver to generate gate drive signals based on a gate drive voltage,
        a gate capacitor coupled to both terminals of the gate driver,
        a switch coupled between one terminal of the gate capacitor and one of the plurality of capacitors; and
        a diode and a resistor connected between another terminal of the gate capacitor and a terminal of the gate drive power source,
    wherein the diode prevents backflow of a current to the gate drive power source, and
    wherein one terminal of one of the plurality of capacitors is floated, and the one terminal of one of the plurality of capacitors is connected electrically to one terminal of the switch.

10. The air conditioner according to claim 9, wherein:
    when the switch is turned on, the gate capacitor is configured to store energy based on the gate drive voltage, and
    when the switch is turned off, the gate driver generates the gate drive signals using the energy stored in the gate capacitor.

11. The air conditioner according to claim 10, wherein the switch is turned on when all of the plurality of transistors are turned off.

12. The air conditioner according to claim 9, further comprising:
    an inverter to provide AC power using the energy stored in the plurality of capacitors; and
    an inverter controller to control the inverter.

13. The air conditioner according to claim 9, wherein the plurality of transistors comprises first, second and third transistors, the plurality of diodes comprises a first pair of diodes coupled in series, a second pair of diodes coupled in series, and a third pair of diodes coupled in series, the first pair, second pair and third pair being coupled in parallel, wherein a first node between the first pair of diodes is coupled to the first transistor, a second node between the second pair of diodes is coupled to the second transistor, and a third node between the third pair of diodes is coupled to the third transistor.

14. A motor driving device comprising:
an AC/DC converter;
a plurality of capacitors to store energy based on an output from the AC/DC converter; and
a converter controller to control the operation of the AC/DC converter,
wherein the converter controller includes:
    a switch connected to a floated terminal of one of the plurality of capacitors,
    a gate capacitor for storing energy based on a gate drive voltage,
    a gate driver to generate the gate drive signals, using the energy stored in the gate capacitor, and
    a diode and a resistor connected between a terminal of the gate capacitor and a terminal of the gate drive power source,
wherein the diode prevents backflow of a current to the gate drive power source, and
wherein the floated terminal of one of the plurality of capacitors is connected electrically to one terminal of the switch.

15. The motor driving device according to claim 14, wherein:
    the energy is stored in the gate capacitor when the switch is turned on; and
    the gate driver generates the gate drive signals, which is based on the gate drive voltage, using the energy stored in the gate capacitor, when the switch is turned off.

16. The motor driving device according to claim 15, wherein the switch is turned on when all switching elements configured to be controlled by the gate drive signals in the AC/DC converter are turned off.

17. The motor driving device according to claim 14, wherein the converter controller further includes a resistor connected to the gate capacitor and a terminal of the gate drive power source.

18. The motor driving device according to claim 14, wherein each of the plural switching elements in the AC/DC converter is connected to a virtual neutral point among the plural capacitors.

19. The motor driving device according to claim 14, wherein AC/DC converter comprises:
    a 3-phase rectifier; and
    a plural switching elements each connected between the 3-phase rectifier and a virtual neutral point among the plural capacitors.

* * * * *